United States Patent [19]
Belady

[11] Patent Number: 6,133,631
[45] Date of Patent: Oct. 17, 2000

[54] SEMICONDUCTOR PACKAGE LID WITH INTERNAL HEAT PIPE

[75] Inventor: Christian L. Belady, McKinney, Tex.

[73] Assignee: Hewlett-Packard Company, Palo Alto, Calif.

[21] Appl. No.: 08/866,898

[22] Filed: May 30, 1997

[51] Int. Cl.[7] .................................................. H01L 23/34
[52] U.S. Cl. ........................................ 257/714; 257/713
[58] Field of Search ................................... 257/712, 713, 257/714, 715

[56] References Cited

U.S. PATENT DOCUMENTS

| | | | |
|---|---|---|---|
| 4,880,052 | 11/1989 | Meyer, IV et al. | 165/104.14 |
| 5,323,292 | 6/1994 | Brezinski | 257/714 |
| 5,355,942 | 10/1994 | Conte | 165/104.33 |
| 5,880,524 | 3/1999 | Xie | 257/713 |

FOREIGN PATENT DOCUMENTS

| | | |
|---|---|---|
| 0521836 | 7/1988 | European Pat. Off. . |
| 02110296 | 4/1990 | Japan . |
| 04184963 | 1/1992 | Japan . |
| 4-146657 | 5/1992 | Japan ..................................... 257/715 |
| 04356000 | 9/1992 | Japan . |
| 2278676 | 7/1994 | United Kingdom . |

OTHER PUBLICATIONS

Anonymous: "Heat Pipe Spreader Plate" IBM TECHNICAL DISCLOSURE BULLETIN, vol. 26, No. 9, Feb. 1984 (1984–02), p. 4789 XP002116202 New York, US.

Primary Examiner—Carl Whitehead, Jr.
Assistant Examiner—Roy Potter
Attorney, Agent, or Firm—Edward L. Miller

[57] ABSTRACT

The thermal resistance to lateral flow of heat flux through the lid of a semiconductor package may be reduced by incorporating one or more heat pipes into the lid itself. This has the further benefit of reducing the effective thermal resistance of the mechanical interface between the lid of the package and an external heat sink, owing to an increased area over which the heat flux is conducted. The result is a reduced temperature at the source of heat inside the semiconductor package.

2 Claims, 4 Drawing Sheets

SEMICONDUCTOR PACKAGE LID WITH INTERNAL HEAT PIPE

BACKGROUND OF THE INVENTION

Many semiconductor packages, whether for individual power devices, large microprocessors or hybrid assemblies of several integrated circuits attached to a single substrate, run hot enough to require a heat sink. Heat sinks are effective because they conduct the heat flux originating in the semiconductor material into regions where there is sufficient surface area to transfer the heat to another medium (generally air) at a rate sufficient to prevent an undesirable rise in temperature in the device to which the heat sink is attached. Since power dissipation (heat) usually originates in a local region that is small relative to the entrance area of the heat sink, internal dispersion of heat to within the heat sink can be improved by including one or more heat pipes inside the heat sink, near where it is attached to the semiconductor package being cooled.

This is all well and good, but as shown in FIG. 1, the entire flux of heat energy still has to transit the path from the semiconductor die 1, through the lid of the package 2 and into the heat sink 3. That path has a cross section whose effective extent is delimited by arrows 4, and that at its start is equal to the area of contact of the die 1 with the inside of the lid 2 of the semiconductor package. To keep the temperature of the die 1 as low as possible it is desirable that cross sectional area of that path 4 increase (by reaching the heat sink 3) before there is too great an increase in temperature at the die 1. Unfortunately, the thermal resistance of that portion of the thermal path from the die 1 (or dies) to the heat sink 3 is often high enough that it becomes the limiting factor for power dissipation, rather than the limit being determined by a heat sink operating at ambient temperature. That is, it can be the case that using a "better" heat sink (such as one that includes a heat pipe 5) does not result in a significant reduction in die temperature for operation at a given power level.

There are at least three reasons for this, and they include the thermal resistance of the (internal) mechanical interface between the die and the inside of the lid, the thermal resistance of the cross section of the lid as the heat flux travels laterally through it to spread out for contact with the larger external heat sink, and the thermal resistance across the (external) mechanical interface of the surface of the lid with the surface of the heat sink. The thermal resistance of the internal mechanical interface can be reduced by the use of thermally conductive compounds. The thermal resistance of the external mechanical interface is affected by the fit and finish of the two parts. Even what appears to be good surface to surface contact can be adversely affected by microscopic features. Even so, the external mechanical interface itself can generally be made a good as needed by proper sizing, machining, and the use of a suitable thermal compound between the parts. That leaves lateral flow of heat flux through the lid of the package as the remaining untamed source of significant thermal resistance. If the thermal resistance of lateral heat flow through the lid could be lowered, then for a particular heat sink configuration a die (or a collection of dies in a hybrid) could operate at higher power for a given temperature or at a lower temperature for a given power. In really high power systems such an improvement may mean the difference between "passive" cooling by convection using ambient air and the need for actual refrigeration.

SUMMARY OF THE INVENTION

The thermal resistance to lateral flow of heat flux through the lid of a semiconductor package may be reduced by incorporating one or more heat pipes into the lid itself. This has the further benefit of reducing the effective thermal resistance of the mechanical interface between the lid of the package and an external heat sink, owing to an increased area over which the heat flux is conducted. The result is a reduced temperature at the source of heat inside the semiconductor package.

DESCRIPTION OF A PREFERRED EMBODIMENT

Figure 1:
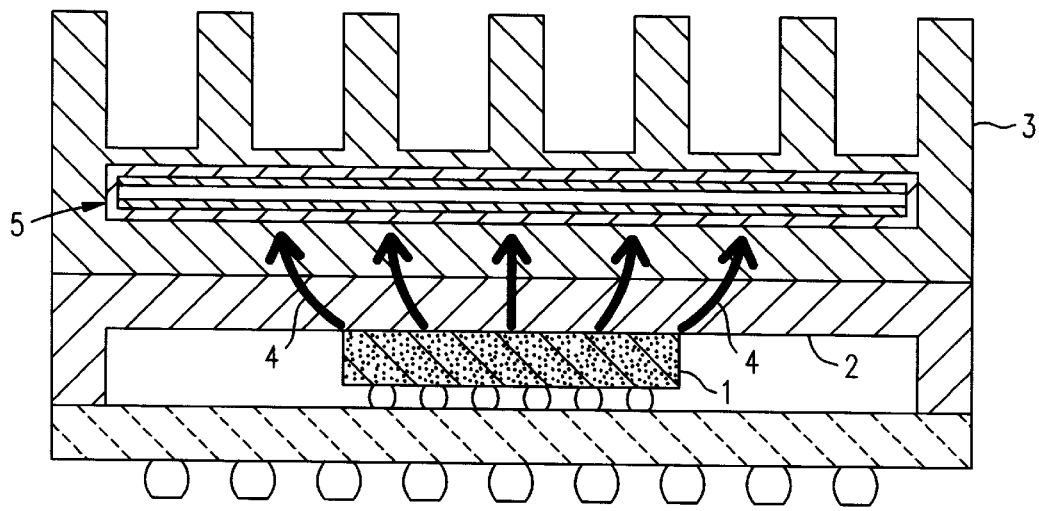
FIG. 1 is a simplified cross sectional view of a prior art use of heat pipes in connection with a heat sink for dissipation of heat generated in a semiconductor package.
Figure 2:
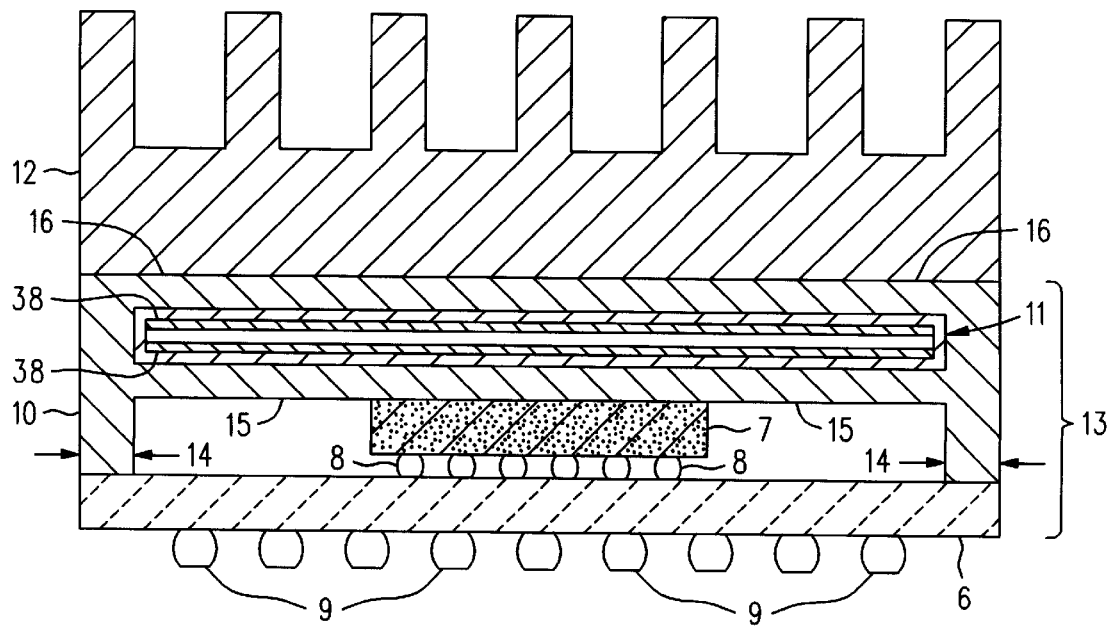
FIG. 2 is a simplified cross sectional view of a semiconductor package lid having an internal heat pipe and used in conjunction with an ordinary heat sink in the dissipation of heat generated in the semiconductor package.

Refer now to FIG. 2, wherein is shown a simplified cross sectional view of a semiconductor package 13 whose lid 10 has one or more internal heat pipes 11 to produce an improved thermal connection between one or more dies 7 and a heat sink 12 attached to the lid 10.

Before proceeding, it may be useful to clarify the method used to interconnect the die 7 to the substrate 6, and subsequently to a larger assembly (not shown), such as a printed circuit board. The method used is the so-called "C4 attach", after IBM's terminology for this particular technique. In this technique there are no bonding wires; instead, the underside of the die 7 has what amounts to a land grid array of metallic signal pads (not shown) that are brought into registration with a matching array of pads (also not shown) on the top side of the substrate 6. Tiny solder balls 8 mechanically fasten the die 7 to the substrate 6 while at the same time producing the necessary electrical connections between the die 7 and the substrate 6. The substrate 6 is really a multi-layer assembly, complete with vias and internal interconnect planes that allow the array of interconnect signals to spread out and be rearranged, finally appearing on the underside of the substrate 6 as a somewhat larger pattern of signal pads (not shown, either). This physically larger pattern resembles a land grid array that can then be connected by solder balls 9 to a host assembly, such as a printed circuit board (not shown).

It will be appreciated that while we have shown but a single die on a substrate, there might be several, as for a large hybrid assembly including a processor and a number of memory chips. Alternatively, the die might not contain a large collection of digital circuitry (e.g., a processor) but could instead contain a single power transistor or perhaps a small number of devices configured as an amplifier. What is of interest here is that whatever the circuitry is, the die or dies that contain it are in intimate thermal contact with the underside of a package lid whose outside surface is intended to receive a heat sink. Given those circumstances, the goal is to make the lid a better thermal path from the dies or dies to the heat sink.

Thus, in FIG. 2 it will be noted that the die 7 is in mechanical contact (preferably through a thermal compound, but which is not shown) with the underside 15 of lid 10. Generally parallel to that underside 15 (which is recessed to provide clearance for the die 7 when the lid 10 is against the substrate) is the outer surface 16 of the lid 10, which is the surface that receives the heat sink 12. Between the two surfaces 15 and 16 are located one or more heat pipes 11. The heat pipe(s) 11 laterally disperse heat from the die 7 across the lid 10 so that there is a lowered thermal resistance in the path from the die 7 to the heat sink 12. Notice that inside a heat pipe 11 there is a hollow wicking structure 38 whose outer surface is in mechanical and thermal contact with the inside surface of the outer sleeve or containment vessel of the heat pipe.

The heat pipes 11 may be any of a variety of commercially available heat pipes, such as those available from Thermacore, Inc, of Lancaster, Pa. It is preferred that the working fluid in the heat pipes be water, the better to avoid concerns related to the disposal of what might possibly be deemed hazardous material. It is also preferred that the wicking structure be one that permits operation is all attitudes or orientations relative to gravity.

Figure 3A:
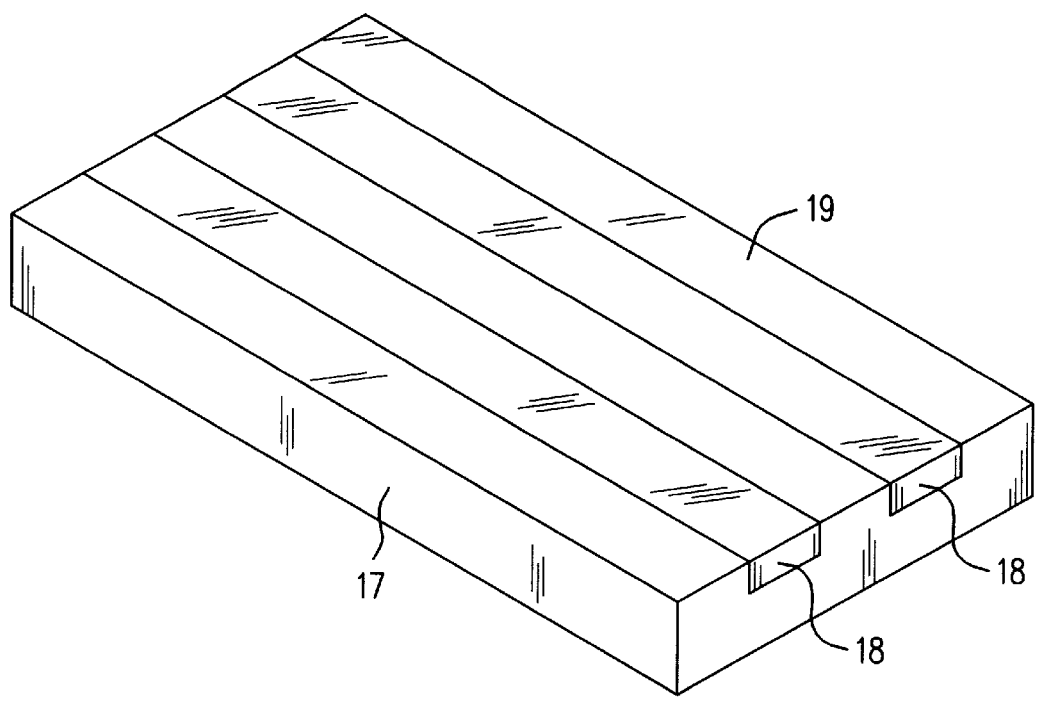
FIGS. 3A and 3B are simplified top and bottom isometric views of a semiconductor package lid having heat pipes located in channels formed in the outer top surface of the lid and which extend completely across the lid.
Figure 3B:
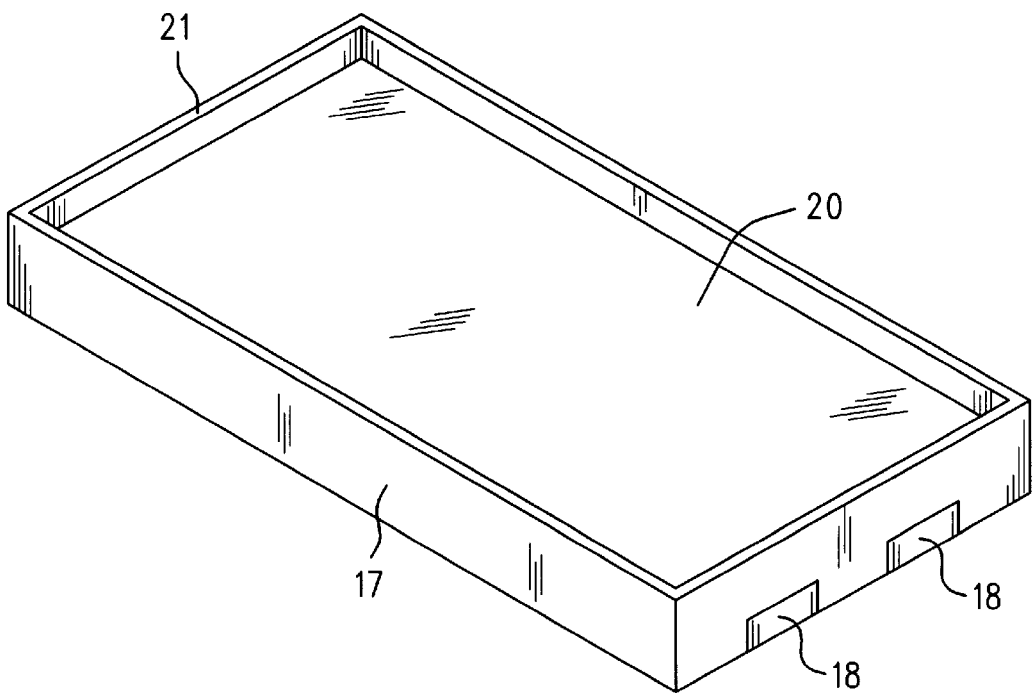

Refer now to FIGS. 3A and 3B. In this embodiment two heat pipes of rectangular cross section are embedded into slots 18 in the lid 17. The slots may be 0.27" wide and 0.14" inches deep. The figure shows two slots 18, but anywhere from, say, one to five (or even more) slots may be useful. The heat pipes might be 0.21" by 0.08" by 5" in size, and may be soldered or epoxied in place. Suitable materials for the lid 17 include aluminum, aluminum silicon, aluminum silicon carbide, copper, and copper tungsten. The outer containment vessel of the heat pipes may be of copper. Wicking structures for the heat pipes include fibers, sintered copper or a mesh of copper. The heat pipes may be charged with deionized water under a partial vacuum. A variety of other materials for the wick and working fluid (e.g., ammonia, acetone, methanol) are known, and are practical for this application.

After the heat pipes (which are not themselves visible, owing to the adhesive used to affix them into the slots 18) are "potted" into place, it may be desirable to remove any excess adhesive by sanding, grinding or milling, so as to leave a smooth and flat top surface 19 suitable for contact with the heat sink (not shown).

FIG. 3B shows the underside of the lid 17. Notice the recessed surface 20, surrounded by a raised periphery 21. The amount of recess may be, say, 0.40'. The raised periphery 21 makes contact with the substrate.

Figure 4A:
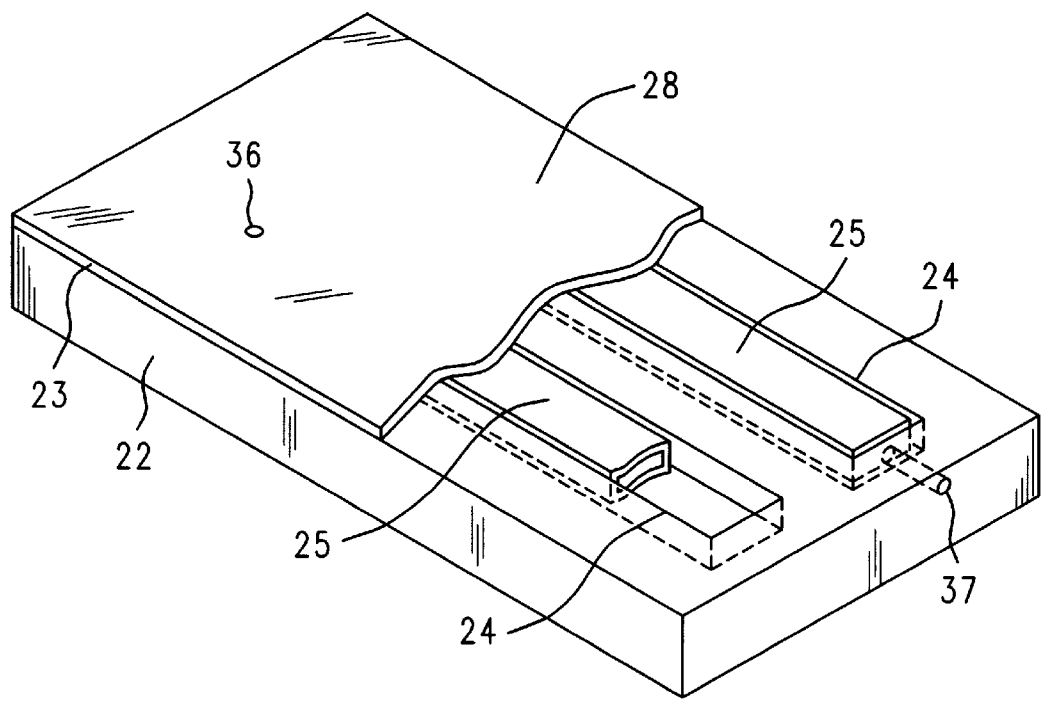
FIGS. 4A and 4B are simplified top and bottom isometric views of a semiconductor package lid having heat pipes whose containment vessels are slots formed entirely within an intermediate top surface of the lid and subsequently covered by an outer cover.
Figure 4B:
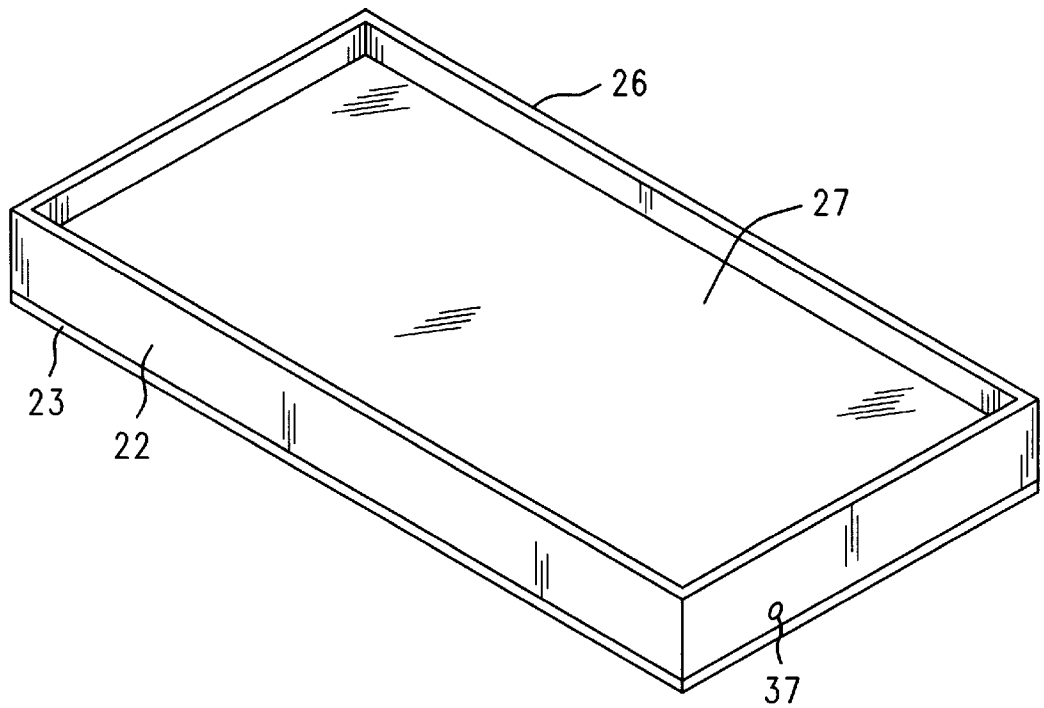

Refer now to FIGS. 4A and 4B. This embodiment dispenses with individual component heat pipes in favor of the lid 22 itself and a cover plate 23 cooperating to create the outer containment vessel for one or more heat pipes. To this end the lid 22 has one or more slots 24 covered by a cover plate 23. During manufacture the slots 24 receive respective hollow wicking structures 25. The outer surface of hollow wicking structures 25 have a shape that allows them to fit snugly into the slots 24 and their cover plate 23, so as to be in mechanical and thermal contact therewith. The cover plate 23 is then hermetically affixed. Each heat pipe can then be evacuated and charged with a working fluid through a small hole such as hole 36 located in the cover 23 or a small hole 37 located in the end of the lid 22. The holes would, of course, be sealed after those operations. The result is a lid assembly (22/23) that is also intrinsically a heat pipe. Surface 28 on the lid 23 receives the heat sink (not shown).

FIG. 4B shows the underside of the lid 22 and cover plate 23. Note the raised periphery 26 surrounding a recessed surface 27. These correspond to their counterparts described in connection with FIG. 3B.

Suitable materials for the construction of the lid/heat pipe of FIGS. 4A and 4B include all those mentioned in connection with the embodiment of FIGS. 3A and 3B.

Figure 5A:
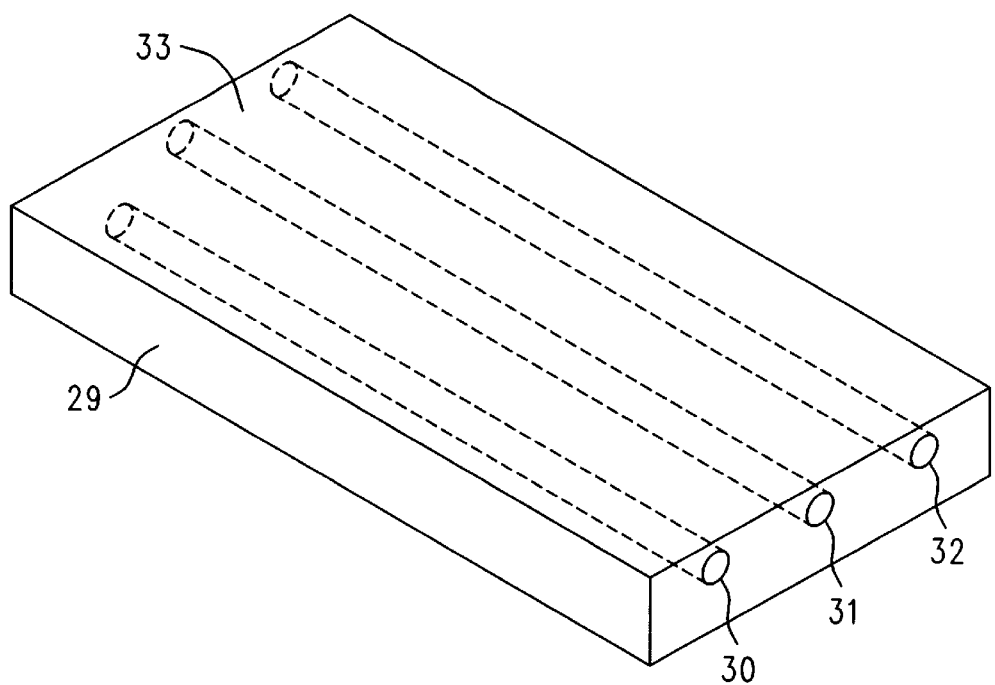
FIGS. 5A and 5B are simplified top and bottom isometric views of a semiconductor package lid having heat pipes located in holes bored in an edge of the lid.
Figure 5B:
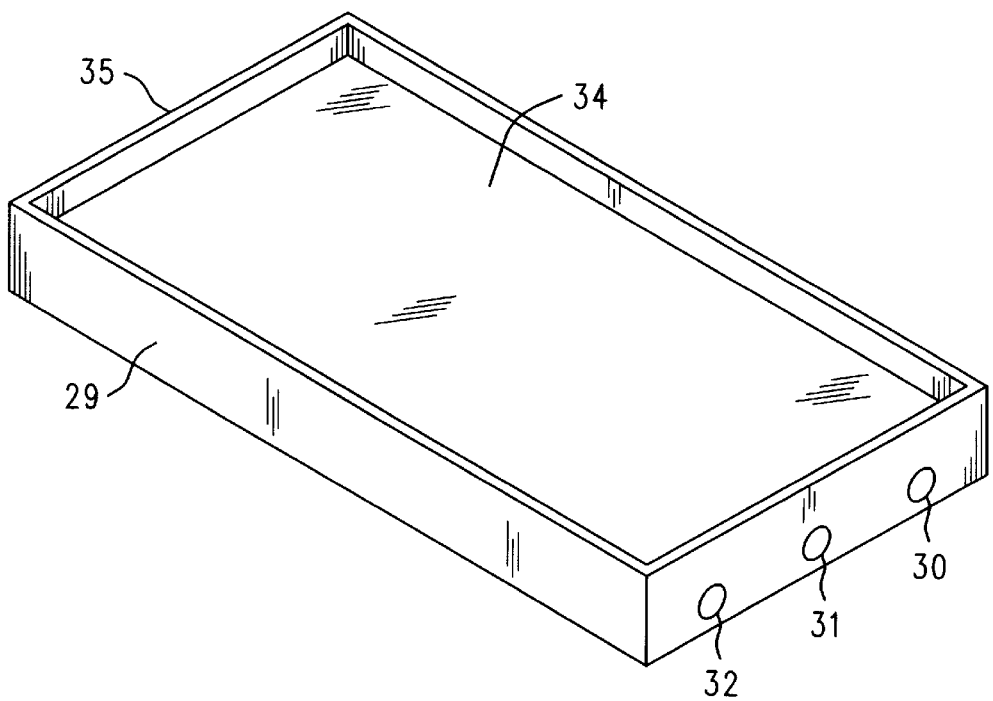

Now consider the embodiment shown in FIGS. 5A and 5B. Here a lid 29 has a number of bore holes 30, 31 and 32 therein, which may be 4 mm in diameter. The lid 29 itself may be on the order of one quarter of an inch in height. For simplicity in the drawing, and flexibility in the description of this embodiment, we have not shown the heat pipes. In brief, this embodiment (FIG. 5) can be like either the one of FIGS. 3A–B or the one of FIGS. 4A–B. That is, (as in the case of FIG. 3) one could take pre-existing separate heat pipes (either completed, or in kit form, as it were) and locate them in the bores 30, 31 and 32. Bore 30 is depicted as not passing all the way through the lid 29, whereas bores 31 and 32 are. Which style to use is, for a FIG. 3 style embodiment, a matter of choice. Methods for securing the heat pipes into the bores include adhesives, soldering and swaging or expanding them into place. Some of these, such as the swaging or expanding, may be more conveniently performed if the heat pipes are not fully assembled before their outer tubes (containment vessels) are affixed in the bores. If they are to be epoxied into place, then they might more conveniently be already completely functional finished heat pipes.

On the other hand, if the embodiment of FIGS. 4A and 4B is desired, then bore holes that do not go all the way through (such as 30) are probably most desirable. In this case a close fitting hollow wicking structure (not shown) is placed into the bore, after which the bore is evacuated and charged with a working fluid. Finally, the end of the bore plugged with a hermetic seal.

As before, suitable materials as described in connection with FIG. 3. Surface 33 receives the heat sink (not shown), and the view in FIG. 5B corresponds to the underside views of FIGS. 3B and 4B.

I claim:

1. A semiconductor package lid that conducts heat from a semiconductor die to a heat sink, the lid comprising:

a cover having a top surface that permits thermal contact with a heat sink and having an underside;

the top surface having a channel therein;

the underside having a periphery within which the underside has a recessed surface that provides clearance for, and permits thermal contact with, a semiconductor die; and at least one heat pipe embedded in the channel and between the top surface and the recessed surface.

2. A semiconductor package lid that conducts heat from a semiconductor die to a heat sink, the lid comprising:

a cover base having a top surface and having an underside;

the underside having a periphery within which the underside has a recessed surface that provides clearance for, and permits thermal contact with, a semiconductor die; and at least one slot in the top surface of the cover base;

a wicking device disposed inside each slot;

a cover plate having a top surface that permits thermal contact with a heat sink and having an underside that is in hermetically sealed contact across each slot in the cover base and in thermal contact with the top surface of the cover base; and each slot in the cover base being under vacuum and partially filled with a fluid that evaporates when heated.

* * * * *